United States Patent
Kobayashi et al.

(10) Patent No.: US 6,819,721 B1
(45) Date of Patent: Nov. 16, 2004

(54) LIMITING METHOD AND LIMITER APPARATUS

(75) Inventors: Shouichi Kobayashi, Kanagawa (JP); Hiroki Shinde, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 820 days.

(21) Appl. No.: 09/650,595

(22) Filed: Aug. 30, 2000

(30) Foreign Application Priority Data

Aug. 31, 1999 (JP) .................................. P.11-246157

(51) Int. Cl.[7] .................... H04L 27/36; H04L 27/04
(52) U.S. Cl. .............................. 375/298; 375/295
(58) Field of Search ............................ 375/316, 295, 375/298; 455/522

(56) References Cited

U.S. PATENT DOCUMENTS

| 5,414,735 A | 5/1995 | Whikehari | |
|---|---|---|---|
| 5,621,762 A | * 4/1997 | Miller et al. | 375/298 |
| 5,694,431 A | * 12/1997 | McCoy | 375/295 |
| 5,740,207 A | 4/1998 | Tong et al. | |
| 5,838,208 A | 11/1998 | Fukushi | |
| 5,942,955 A | 8/1999 | Matui | |
| 6,009,090 A | * 12/1999 | Oishi et al. | 370/342 |
| 6,298,094 B1 | * 10/2001 | Dehner et al. | 375/295 |

FOREIGN PATENT DOCUMENTS

JP 5-328776 12/1993

* cited by examiner

Primary Examiner—Stephen Chin
Assistant Examiner—Lawrence B Williams
(74) Attorney, Agent, or Firm—Pearne & Gordon LLP

(57) ABSTRACT

A limiting method is provided which limits signals having two components I channel and Q channel on two orthogonal coordinate axes within a predetermined range on the coordinate plane specified by the two coordinate axes, wherein the predetermined range is defined by concentric circles having the origin of the two coordinate axes as a center.

2 Claims, 12 Drawing Sheets

LIMITING METHOD AND LIMITER APPARATUS

BACKGROUND OF THE INVENTION

The present invention relates to a limiting method and limiter apparatus, and in particular to limiter apparatus for suppressing the peak factor of transmission power for multiple users in the CDMA technology is used as a multiple access system.

In a mobile radio communications system, especially in a cellular portable telephone system, a base station uses the multiple access scheme to access idle radio links for communications in order to simultaneously communicate with a plurality of mobile stations (communication end offices). The multiple access scheme is roughly divided into the Frequency Division Multiple Access (FDMA) system, Time Division Multiple Access (TDMA) scheme, and Code Division Multiple Access (CDMA) scheme. The base station assigns multiple access parameters to mobile stations, depending on the multiple access scheme of the radio communications system used.

While a plurality of channels are prepared with different frequencies in the FDMA scheme and with shifted time in the TDMA scheme, the CDMA scheme uses both frequency and time for multiple access and identifies channels via inherent codes sent over signals thus resulting in worse frequency use efficiency and requiring broadband circuits. However, the CDMA scheme is characterized in that the scheme ensures a high privacy because signals are converted by overlaying codes and thus the CDMA scheme enjoys a widespread use.

In the CDMA scheme, a large current may flow instantaneously especially during multiple processing. Thus the so-called limiter feature for limiting transmission power is very important.

Conventionally, as shown in FIG. 11, limiter apparatus used in the CDMA scheme is composed of a comparator for comparing a limit value and transmission data and a suppressor for suppressing the limit value in case the transmission data is larger than the limit value.

In this apparatus, as shown in FIG. 12, each time input signals comprising I channel and Q channel are input as parallel data, the input data is compared with the limit value. Send data not to be limited is passed through the suppressor and transmission data to be limited is individually limited.

In such conventional limiter apparatus, there was a problem that transmission data was individually limited and the peak factor could not be suppressed. In case phase-rotated transmission data is limited, the maximum power of the transmission data may drop by as much as 3 dB due to constraints on the input dynamic range of a D/A converter, thus making it difficult to optimize the number of users and transmission power.

As another example, a limiting circuit as shown in FIG. 13 is proposed. This circuit is adapted to adjust gain via a variable gain multiplier 15 depending on the limit value preset by the limit value setting section 2 in case input signals comprising I channel and the Q channel are input as parallel data, as well as to multiply I channel and Q channel of signals which exceeded a value by the limit value respectively via a limiting circuit 16, and to output the resulting value as I channel and the Q channel.

The limiting circuit 16 is a limit operation unit which detects whether the limit value is exceeded or not for the I channel axis and the Q channel axis representing I channel and Q channel respectively and which has a limit range in the shape of an octagon as a vertical cross section. The limit area is shown in FIG. 14.

Operation of the limiter apparatus is described below.

When the input I channel and Q channel data is input as parallel data, the variable gain multiplier circuit 15 obtains the sum of the absolute values of I channel data and Q channel data and compares the sum of the absolute values with a limit value preset by the limit value setting section 2. In case the sum of the absolute values is above $2^{1/2}$ times the limit value, signals obtained by multiplying the input I channel and Q channel signals by $2^{1/2}$ are divided by the sum value and the resulting values are output as output signals. On the other hand, in case the sum of the absolute values is equal to or below $2^{1/2}$ times the limit value, signals are output without multiplication, so that the absolute values of the input I channel signal and Q channel signal converted by the variable gain multiplier circuit will not exceed the predetermined limit value. The limit operation unit is described in for example Japanese Patent Publication No. 5-328776.

Because, in the conventional method, limiting operation was made on I channel and Q channel transmission data individually, there was a problem that a larger limit value led to insufficient suppression effects. Further, when I channel and Q channel transmission data which were phase-rotated, the maximum power of the I channel and Q channel transmission data was excessively suppressed due to constraints on the input dynamic range of the D/A converter which received limiter apparatus output.

SUMMARY OF THE INVENTION

The object of the invention proposed in view of the circumstances is to enable appropriate power control and to optimize transmission power.

In order to attain this object, in the first aspect of the invention, a limiting method comprises a step of: limiting signals having two components I channel and Q channel on two orthogonal coordinate axes within a predetermined range on the coordinate plane specified by the two coordinate axes, wherein the predetermined range is defined by concentric circles having the origin of the two coordinate axes as a center.

According to such a method, optimum power suppression is enabled without excessively suppressing the maximum power.

In the second aspect of the invention, a limiting method comprises steps of: calculating the instantaneous power of signals having two components I channel and Q channel on two orthogonal coordinate axes of data to be sent; determining whether the instantaneous power is within a predetermined range or not; and a step for shifting the instantaneous power in the direction of the origin on straight lines connecting the origin and the signal component coordinates, in case the instantaneous power is determined to exceed the predetermined range.

According to such a configuration, optimization of power is possible with ease and efficiency.

In the third aspect of the invention, limiter apparatus comprises: an instantaneous power calculator for calculating an instantaneous power value from transmission data; a limit value setting section for setting a limit value; a comparator for comparing the instantaneous power value calculated by the instantaneous power calculator with the limit value; a correction determining section for determining whether transmission data is to be corrected or not depending on the comparison result of the instantaneous power value and the limit value; and a correction operating section for correcting the transmission data based on the correction value determined by the correction determining section.

According to such apparatus, power can be optimized with excellent efficiency.

In the fourth aspect of the invention, limiter apparatus comprises: an instantaneous power calculator for calculating an instantaneous power value from parallel input data composed of I channel and Q channel; a limit value setting section for setting a limit value; a divider-comparator for dividing the instantaneous power value calculated by the instantaneous power calculator by the limit value set by the limit value setting section to compare the instantaneous power with the limit value; a correction determining section for determining whether the input transmission data is to be corrected or not according to the comparison result; and a correction operating section for correcting the transmission data based on the correction value determined by the correction determining section and the input value.

In addition to the aforementioned effects, a correction value can be calculated via division according to such apparatus. This enables high-accuracy and reliable correction.

In the fifth aspect of the invention, limiter apparatus according to the third aspect of the invention wherein the comparator includes a subtracter-comparator for subtracting the limit value set by the limit value setting section from the instantaneous power value result calculated by the instantaneous power calculator to compare the instantaneous power with the limit value, wherein the correction determining section is adapted to determine whether input data is to be corrected or not depending on the comparison result of the subtracter-comparator.

According to such a configuration, a correction value can be calculated via subtraction alone, without using division, thus simplifying the apparatus configuration.

In the sixth aspect of the invention, limiter apparatus according to the third aspect of the invention wherein the instantaneous power calculator calculates the square value of parallel input I channel and Q channel transmission data without performing root operation of the data, wherein the comparator includes a subtracter-comparator for subtracting the limit value set by the limit value setting section from the instantaneous power value calculated by the instantaneous power calculator to compare the square value of the instantaneous power with the limit value.

According to such apparatus, operation of transmission data is possible without root operation, thus simplifying the operation process.

In the seventh aspect of the invention, limiter apparatus according to the third aspect of the invention further comprises a correction selector for outputting the parallel input I channel and Q channel transmission data without correction, in case correction is not required depending on the result of the correction determining section.

According to such apparatus, high-speed processing can be applied to non-corrected data. Moreover, power consumption can be reduced.

In the eighth aspect of the invention, limiter apparatus comprises: an instantaneous power averaging section for calculating an instantaneous power value from parallel input I channel and Q channel transmission data and obtaining the average value of instantaneous power for a certain period; a limit value setting section for setting a limit value; a comparator for comparing the instantaneous power average value obtained by the instantaneous power averaging section with the limit value; a correction determining section for determining whether the transmission data is to be corrected or not depending on the comparison of the average value of the instantaneous power with the limit value; and a correction operating section for correcting the transmission data based on the correction value determined by the correction determining section.

According to such a configuration, correction determination is made via the average value of instantaneous power, thus allowing a more stable control.

In the ninth aspect of the invention, limiter apparatus according to the eighth aspect of the invention wherein an instantaneous power calculator for calculates the square value of parallel input I channel and Q channel transmission data without performing root operation of the data, wherein the comparator comprises a subtracter-comparator for subtracting the limit value set by the limit value setting section from the instantaneous power value calculated by the instantaneous power calculator to compare the square value of the instantaneous power with the limit value.

In the tenth aspect of the invention, limiter apparatus according to the eighth aspect of the invention further comprises a correction selector for outputting the parallel input I channel and Q channel transmission data without correction, in case correction is not required depending on the result of the correction determining section.

In the eleventh aspect of the invention, limiter apparatus according to the third aspect of the invention further comprises a serial-to-parallel converter for converting transmission data composed of serial input I channel and Q channel to parallel data.

In the twelfth aspect of the invention, limiter apparatus comprises: an instantaneous power maximum value detector for detecting the maximum value of the instantaneous power for a certain period; a limit value setting section for setting a limit value; a comparator for comparing the instantaneous power average value obtained by the instantaneous power maximum value detector with the limit value; a correction determining section for determining whether the transmission data is to be corrected or not depending on the comparison result of the instantaneous power maximum value with the limit value; and a correction operating section for correcting the transmission data based on the correction value determined by the correction determining section.

In the thirteenth aspect of the invention, limiter apparatus according to the third aspect of the invention further comprises a feedback section which inputs as input data the sum of the correction value and the input data again to the instantaneous power calculator to repeat operation.

According to such a configuration, it is possible to perform a coarse operation using an approximate correction value in the first operation, and to perform fine control in the second operation. Performing more than one operation allows a higher-accuracy correction.

DETAILED DESCRIPTION OF THE PREFERRED EMBODIMENTS

Figure 1:
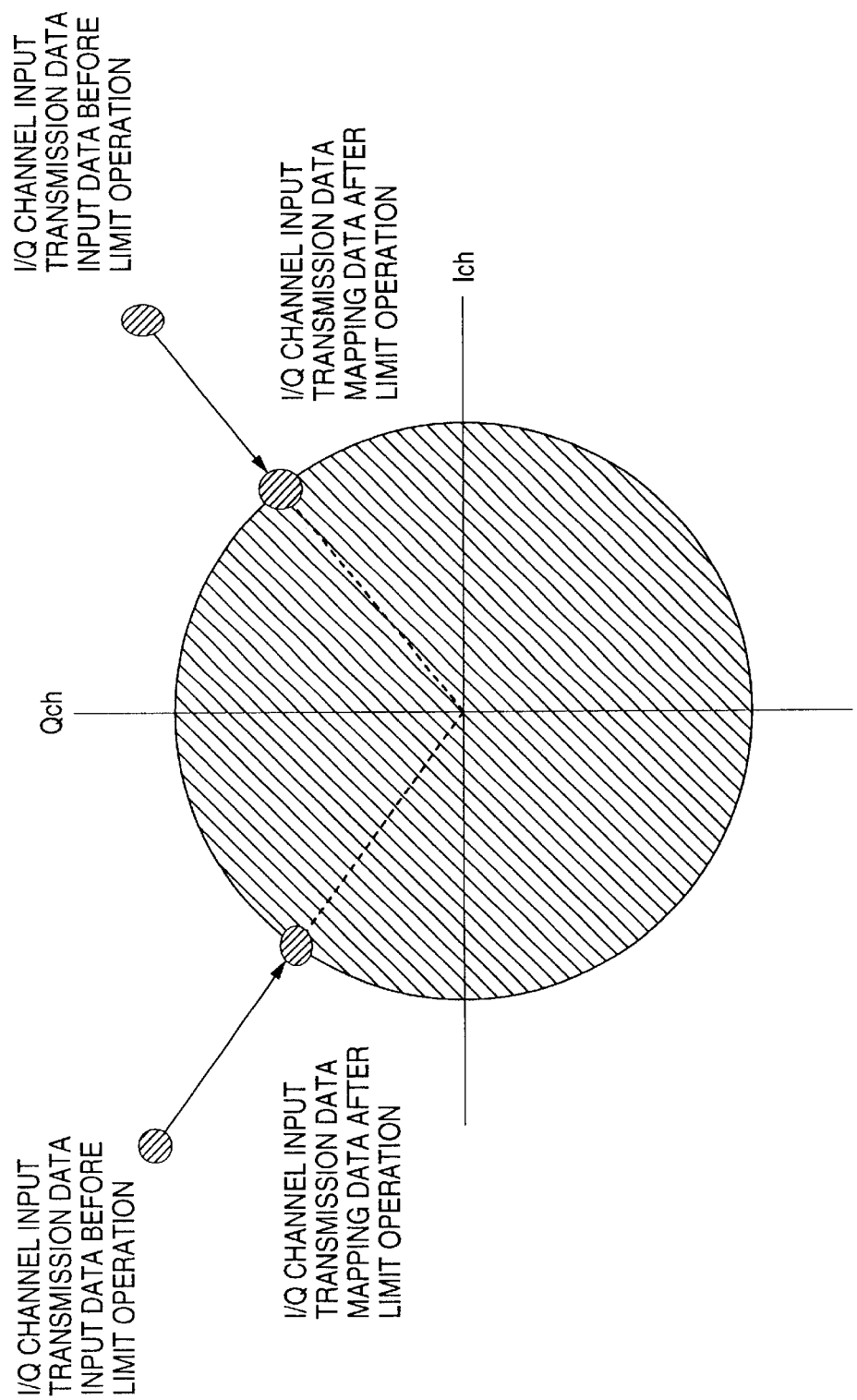
FIG. 1 shows a limit area and a limiting method according to the invention.

The invention provides a limit area of concentric circles as shown in FIG. 1. Values outside the limit area of concentric circles are mapped again on the circumference of concentric circles in the direction of the center of the concentric circles. The invention proposes a limiting method in which instantaneous power of I channel and Q channel is obtained and limiting is performed on the resulting data. This prevents the maximum power of I channel and Q channel from being dropped and suppresses the peak factor of I channel and Q channel transmission data. Embodiments of the invention are described below.

(First Embodiment)

Figure 2:
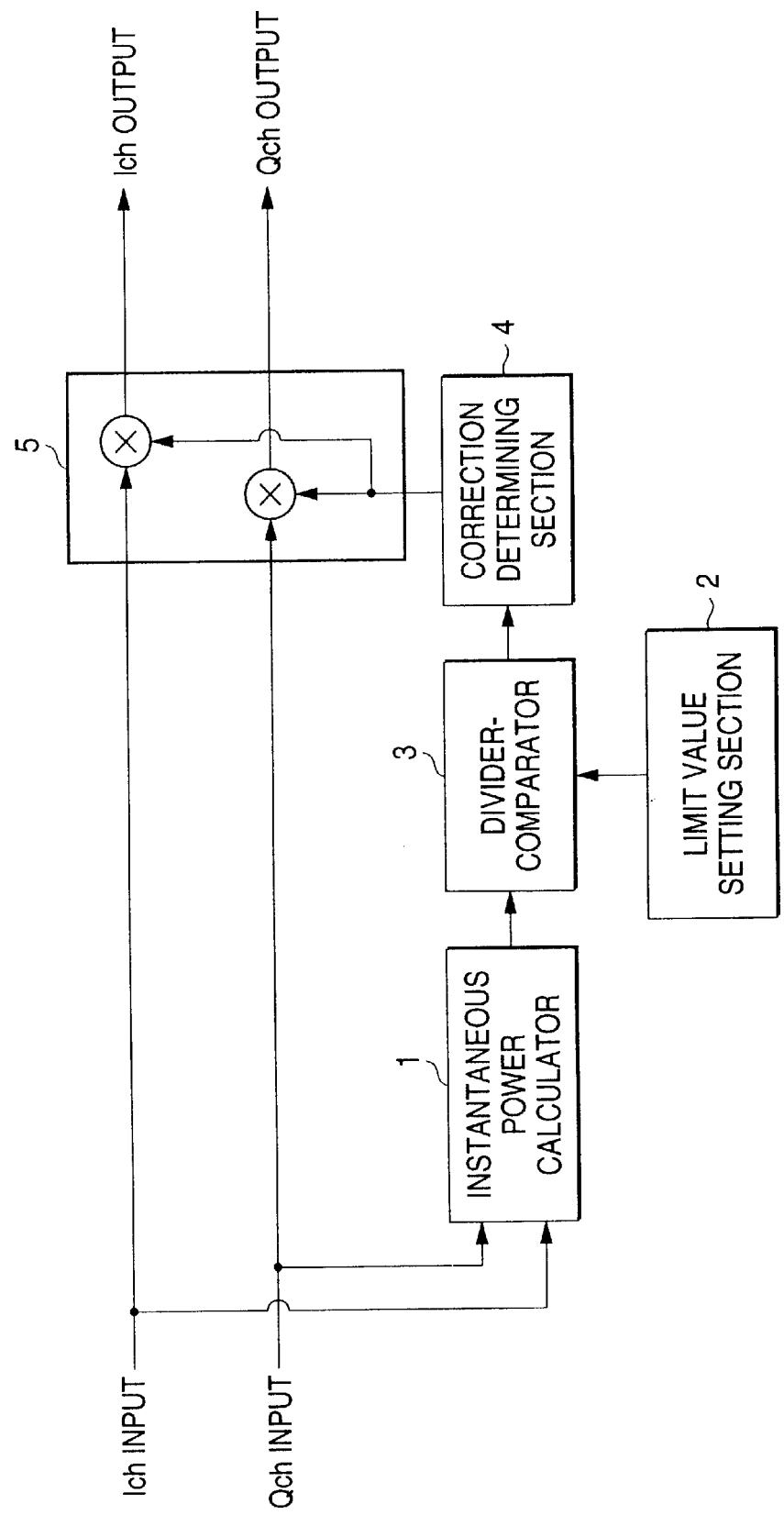
FIG. 2 shows a configuration of limiter apparatus according to the first embodiment of the invention which obtains the instantaneous power, limits the power depending on the result of division-based comparison with a limit value, then outputs corrected data.

FIG. 2 shows a configuration of limiter apparatus according to the first embodiment of the invention. In FIG. 2, limiter apparatus is characterized in that the limiter apparatus comprises an instantaneous power calculator 1 for calculating an instantaneous power value of parallel input data composed of I channel data and Q channel data from the input data, a limit value setting section 2 for setting a limit value, a divider-comparator 3 for dividing the limit value set by the limit value setting section by the instantaneous power value calculated value by the instantaneous power calculator and comparing the instantaneous power value with the limit value by checking whether the resulting value is larger than 1 or not, a correction determining section 4 for determining whether the transmission data is to be corrected or not depending on the comparison result, and a correction operating section 5 for calculating I channel data and Q channel data based on the correction value determined by the correction determining section 4 and the input value.

Operation of the vector operation limiter apparatus according to this embodiment is described below.

An instantaneous power calculator 1 calculates an instantaneous power value of parallel input I channel and Q channel transmission data by using the expression $(Ich^2 + Qch^2)^{1/2}$.

A divider-comparator 3 divides an arbitrary limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. The correction determining section 4 determines that correction be skipped in case the comparison result of the divider-comparator 3 is equal to or greater than 1. The correction determining section 4 determines that correction be made in case the comparison result of the divider-comparator 3 is smaller than 1. In case the correction determining section 4 has determined that correction be made, a correction operating section 5 multiplies the I channel and Q channel input transmission data by the division value used by the divider-comparator 3 to perform correction and outputs the resulting data. In case the correction determining section 4 has determined that correction be skipped, the correction operating section 5 multiplies the I channel and Q channel input transmission data by 1 and outputs the resulting data without compensation.

As mentioned earlier, according to this embodiment, the peak factor of I channel and Q channel input transmission data can be suppressed by obtaining the instantaneous value of I channel and Q channel input transmission data and comparing the instantaneous value with the limit value, then performing correction.

(Second Embodiment)

Figure 3:
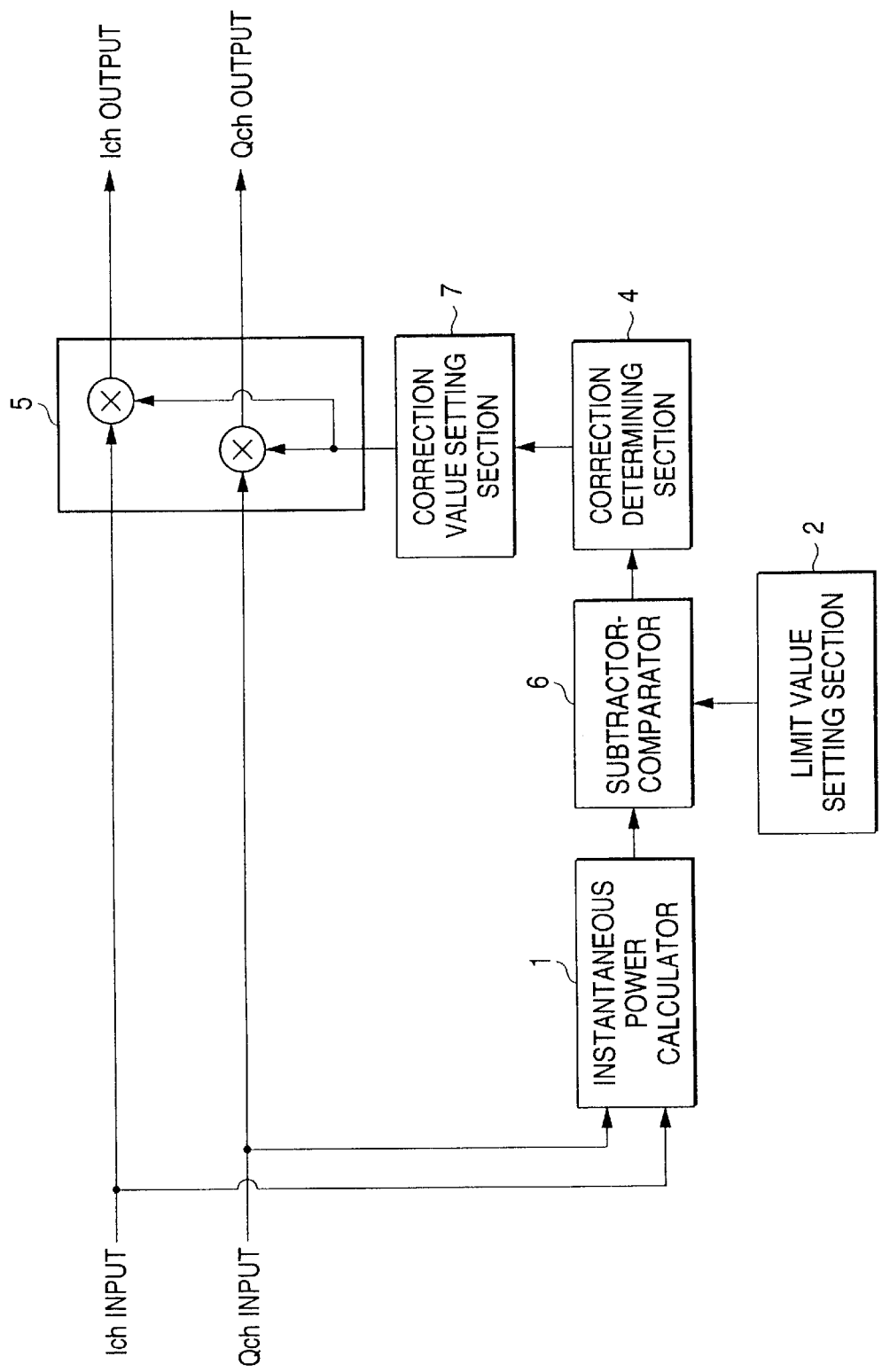
FIG. 3 shows a configuration of limiter apparatus according to the first embodiment of the invention which obtains the instantaneous power, limits the power depending on the result of subtraction-based comparison with a limit value, then outputs corrected data.

FIG. 3 shows a configuration of limiter apparatus according to the second embodiment of the invention. This apparatus is the same as the apparatus of the first embodiment except that the divider-comparator 3 is replaced with a subtracter-comparator 6 and a correction value setting section 7 is used to add a correction value to the correction operating section. The remaining configuration is the same as the first embodiment. That is, as shown in FIG. 3, limiter apparatus according to this embodiment comprises an instantaneous power calculator 1 to which parallel input I channel and Q channel transmission data are input, a limit value setting section 2 for setting an arbitrary limit value, a subtracter-comparator 6 to which the instantaneous power value calculated by the instantaneous power calculator 1 and the limit value set by the limit value setting section 2 are input, a correction determining section 4 to which the comparison result of the subtracter-comparator 6 is input, a correction value setting section (table) 7 to which the result of the correction determining section 4 is input, and a correction operating section 5 to which the correction determination result of the correction value setting section 7 is input.

Operation of the vector operation limiter apparatus according to this embodiment is described below.

An instantaneous power calculator 1 calculates an instantaneous power value of parallel input I channel and Q channel transmission data by using the expression $(Ich^2 + Qch^2)^{1/2}$.

A subtracter-comparator 6 subtracts the instantaneous power value calculated by the instantaneous power calculator 1 from an arbitrary limit value set by the limit value setting section 2. The subtracter-comparator 6 compares the instantaneous power value with the limit value. The correction determining section 4 determines whether the I channel and Q channel input transmission data is to be corrected or not from the comparison result of the subtracter-comparator 6. The correction determining section 4 determines that correction be skipped in case the limit value is equal to or greater than the instantaneous power value as a comparison result of the subtracter-comparator 6. The correction determining section 4 determines that correction be made in case the limit value is smaller than the instantaneous power value as a comparison result of the subtracter-comparator 6. A correction value setting section 7 sets a correction value based on the comparison result of the subtracter-comparator 6 and references the table. The correction operating section 5 multiplies the I channel and Q channel input transmission data by the correction value and outputs the resulting data.

As mentioned earlier, according to this embodiment, the peak factor of I channel and Q channel input transmission data can be suppressed by obtaining the instantaneous value of I channel and Q channel input transmission data and comparing the instantaneous value with the limit value, then performing correction. Using subtraction for comparison provides better comparison result accuracy than using division.

(Third Embodiment)

There is shown a configuration of limiter apparatus according to the third embodiment of the invention. This apparatus is the same as the apparatus of the first embodiment shown in FIG. 2, except that the instantaneous power calculator 1 calculates the sum of square values without performing root operation as well as sets the square value as a limit value. The remaining configuration is the same as the second embodiment.

Limiter apparatus according to this embodiment comprises an instantaneous power calculator 1 to which parallel input I channel and Q channel transmission data are input wherein the instantaneous power calculator 1 does not perform root operation, a limit value setting section 2 for setting an arbitrary limit value, a divider-comparator 3 to which the instantaneous power value calculated by the instantaneous power calculator 1 and the limit value set by the limit value setting section 2 are input, a correction determining section 4 to which the comparison result of the divider-comparator 3 is input, and a correction operating section 5 to which the correction determination result of the correction determining section 4 is input.

Operation of the vector operation limiter apparatus according to this embodiment is described below.

An instantaneous power calculator 1 calculates an instantaneous power value of parallel input I channel and Q channel transmission data by using the expression $(Ich^2 + Qch^2)$. A divider-comparator 3 divides an arbitrary limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value. A correction determining section 4 determines whether the I channel and Q channel input transmission data is to be corrected or not from the comparison result of the divider-comparator 3. The correction determining section 4 determines that correction be skipped in case the comparison result of the divider-comparator 3 is equal to or greater than 1. The correction determining section 4 determines that correction be made in case the comparison result of the divider-comparator 3 is smaller than 1. In case the correction determining section 4 has determined that correction be made, a correction operating section 5 multiplies the I channel and Q channel input transmission data by the division value used by dividing the limit value set by the limit value setting section 2 by the instantaneous power value calculated by the instantaneous power calculator 1 (the instantaneous power value as a denominator and the limit value as a numerator) to perform correction and outputs the resulting data. In case the correction determining section 4 has determined that correction be skipped, the correction operating section 5 multiplies the I channel and Q channel input transmission data by 1 and outputs the resulting data without compensation.

As mentioned earlier, according to this embodiment, accuracy of comparison of the instantaneous value with the limit value is upgraded and operation speed in boosted by skipping a root apparatus in obtaining the instantaneous value of the I channel and Q channel input transmission data. The peak factor of I channel and Q channel input transmission data can be suppressed by correcting I channel and Q channel input transmission data. Further, operation is simplified and high-speed processing is enabled by skipping the root operation.

(Fourth Embodiment)

Figure 4:
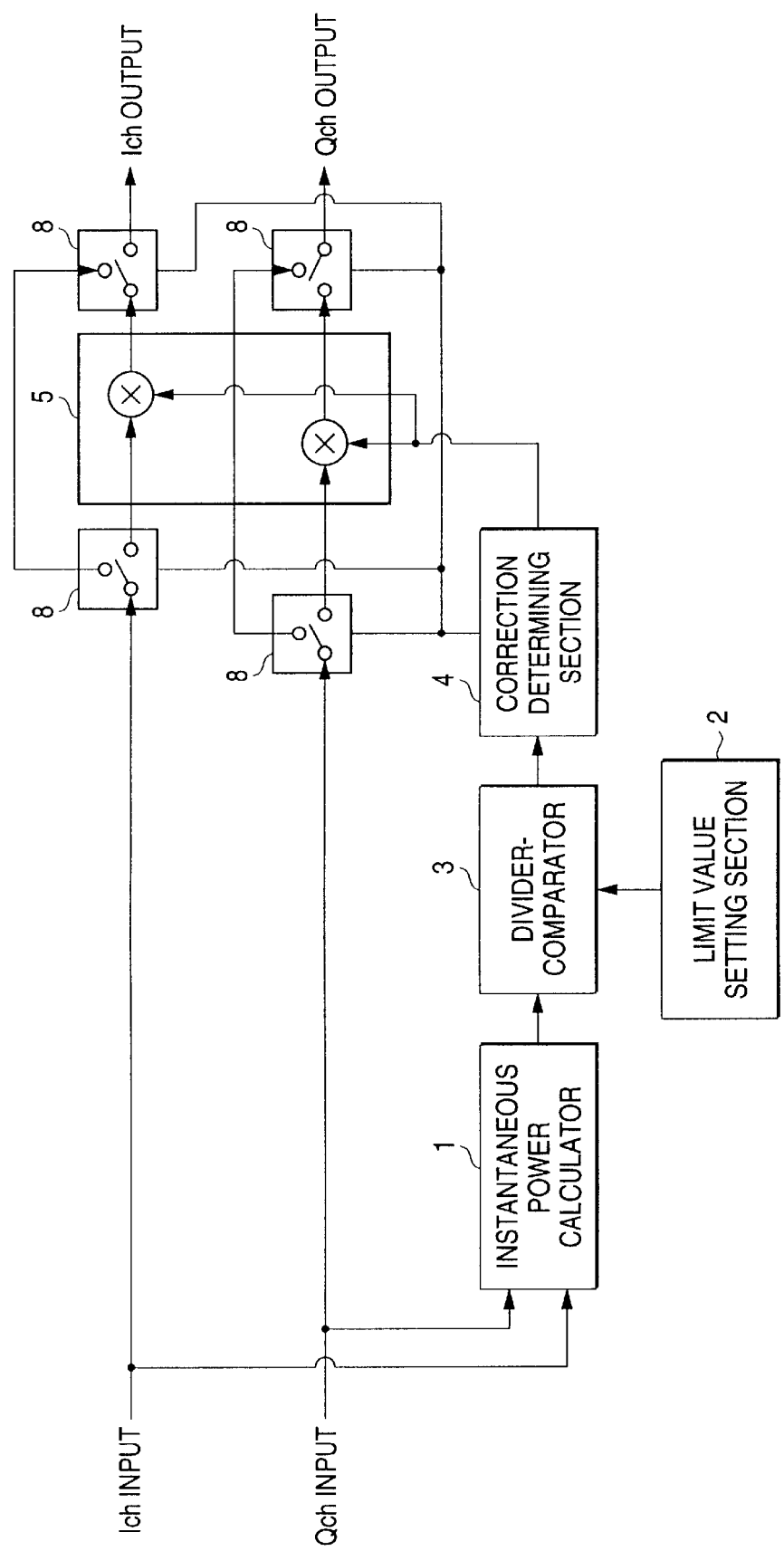
FIG. 4 shows a configuration of limiter apparatus according to the fourth embodiment of the invention which obtains the instantaneous power, performs correction in case correction is required depending on the result of division-based comparison with a limit value, and outputs the original data without performing correction in case correction is not required.

FIG. 4 shows a configuration of limiter apparatus according to the fourth embodiment of the invention. This apparatus is characterized in that correction selectors 8 are provided in the preceding stage and subsequent stage of the correction operating section 5 for I channel and Q channel respectively, and that switching is made between the correction selectors 8 depending on the output of the correction determining section 4.

That is, as shown in FIG. 4, limiter apparatus according to this embodiment comprises an instantaneous power calculator 1 to which parallel input I channel and Q channel transmission data are input, a limit value setting section 2 for setting an arbitrary limit value, a divider-comparator 3 to which the instantaneous power value calculated by the instantaneous power calculator 1 and the limit value set by the limit value setting section 2 are input, a correction determining section 4 to which the comparison result of the divider-comparator 3 is input, a correction operating section 5 to which the comparison value of the divider-comparator 3 is input, and a correction selectors 8 for selecting whether correction operation is to be made via the correction operating section 5 or the correction operating section 5 is to be bypassed.

Operation of the vector operation limiter apparatus configured as mentioned earlier is described below.

An instantaneous power calculator 1 calculates an instantaneous power value of parallel input I channel and Q channel transmission data by using the expression $(Ich^2+Qch^2)^{1/2}$.

A divider-comparator 3 divides an arbitrary limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. In case the correction determining section 4 has determined that correction be made, the output of the correction selector 4 is input to a correction operating section 5 and multiplies the I channel and Q channel input transmission data by the division value obtained by the divider-comparator 3 to perform correction and outputs the resulting data. In case the correction determining section 4 has determined that correction be skipped, the output of the correction selector 8 is output as the I channel and Q channel input transmission data without being corrected by the correction operating section.

As mentioned earlier, according to this embodiment, the peak factor of I channel and Q channel input transmission data can be suppressed by obtaining the instantaneous value of I channel and Q channel input transmission data and comparing the instantaneous value with the limit value, then performing correction of the I channel and Q channel input transmission data. Correction is skipped for 1 channel and Q channel input transmission data which does not exceed the limit value, thus reducing the power consumption of the apparatus.

(Fifth Embodiment)

Figure 5:
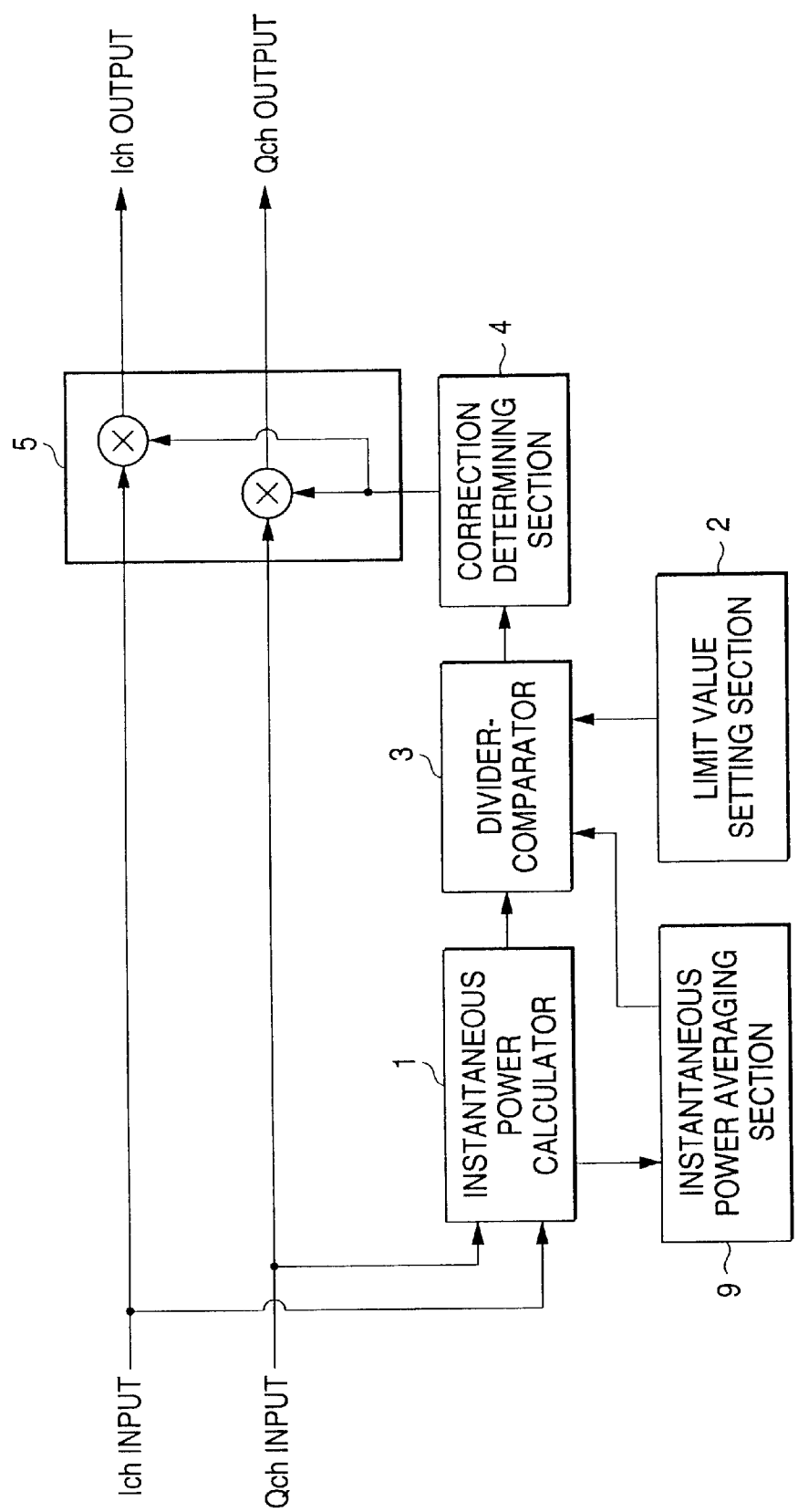
FIG. 5 shows a configuration of limiter apparatus according to the fifth embodiment of the invention which obtains the square value of the instantaneous power, performs expansion correction or reduction correction depending on the result of division-based comparison with a limit value, and outputs the resulting data.

FIG. 5 shows a configuration of limiter apparatus according to the fifth embodiment of the invention. This apparatus comprises an instantaneous power averaging section 9 as well as limiter apparatus according to the first embodiment and adapted to obtain the average value of instantaneous power for a certain period to determine whether the average value exceeds the limit value or not. Output of the instantaneous power averaging section 9 is input to a divider-comparator 3 and compared with the limit value. The remaining configuration is the same as the first embodiment. As shown in FIG. 5, limiter apparatus according to this embodiment comprises an instantaneous power calculator 1 to which parallel input I channel and Q channel transmission data are input, an instantaneous power averaging section 9 to which the instantaneous power of the instantaneous power calculator 1 is input, a limit value setting section 2 for setting an arbitrary limit value, a divider-comparator 3 to which the instantaneous power value of the instantaneous power calculator 1 and the limit value of the limit value setting section 2 are input, and an output of the divider-comparator 3 to which the comparison result of the average value of the instantaneous power averaging section 9 and the limit value set by the limit value setting section 2 are input, a correction determining section 4 to which the comparison result of the divider-comparator 3 is input, and a correction operating section 5 to which the determination result of the correction determining section 4 is input.

Operation of the vector operation limiter apparatus according to this embodiment is described below.

An instantaneous power calculator 1 calculates an instantaneous power value of parallel input I channel and Q channel transmission data by using the expression $(Ich^2+Qch^2)^{1/2}$.

The instantaneous power averaging section 9 calculates the average value for an arbitrary period of the instantaneous power of I channel and Q channel input transmission data of the instantaneous power calculator 1. In case the average value of instantaneous power of the instantaneous power averaging section 9 is below the arbitrary average value and smaller than the limit value set by a limit value setting section 2 for setting an arbitrary limit value, a correction determination section 4 determines that expansion correction be made. A correction operating section 5 multiplies the I channel and Q channel input transmission data by an arbitrary value equal to or greater than 1 to expand the input transmission data value, assuming the limit value as a maximum value. In case the average value of instantaneous power of the instantaneous power averaging section 9 is greater than the limit value set by a limit value setting section 2, a divider-comparator 3 divides the limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. In case the comparison result of the divider-comparator 3 is below 1, the correction operating section 5 multiplies the I channel and Q channel input transmission data by the division value used by the divider-comparator 3 to perform correction and outputs the resulting data. In case the comparison result of the divider-comparator 3 is equal to or greater than 1, the correction operating section 5 multiplies the I channel and Q channel input transmission data by 1 and outputs the resulting data without compensation.

As mentioned earlier, according to this embodiment, small transmissioning power can be expanded by obtaining the instantaneous value of the I channel and Q channel input transmission data and by comparing the average value of instantaneous power with the limit value. The peak factor of I channel and Q channel input transmission data can be suppressed by correcting a value exceeding the limit value. This allows use of power to its maximum.

(Sixth Embodiment)

The sixth embodiment of the invention uses the same apparatus as the fifth embodiment. In the apparatus configuration shown in FIG. 5, output of an instantaneous power averaging section 9 is input to a limit value setting section 2 to control the limit value of the limit value setting section 2. In this embodiment, the apparatus is adapted to reduce the output of the instantaneous power calculator in case the output is larger than the limit value by a predetermined value. While expansion correction is made in the fifth embodiment, reduction correction is made in this embodiment.

As mentioned earlier, according to this embodiment, the peak factor of I channel and Q channel input transmission data can be suppressed by obtaining the instantaneous value of I channel and Q channel input transmission data and comparing the instantaneous value with the limit value, then performing reduction correction.

(Seventh Embodiment)

Figure 6:
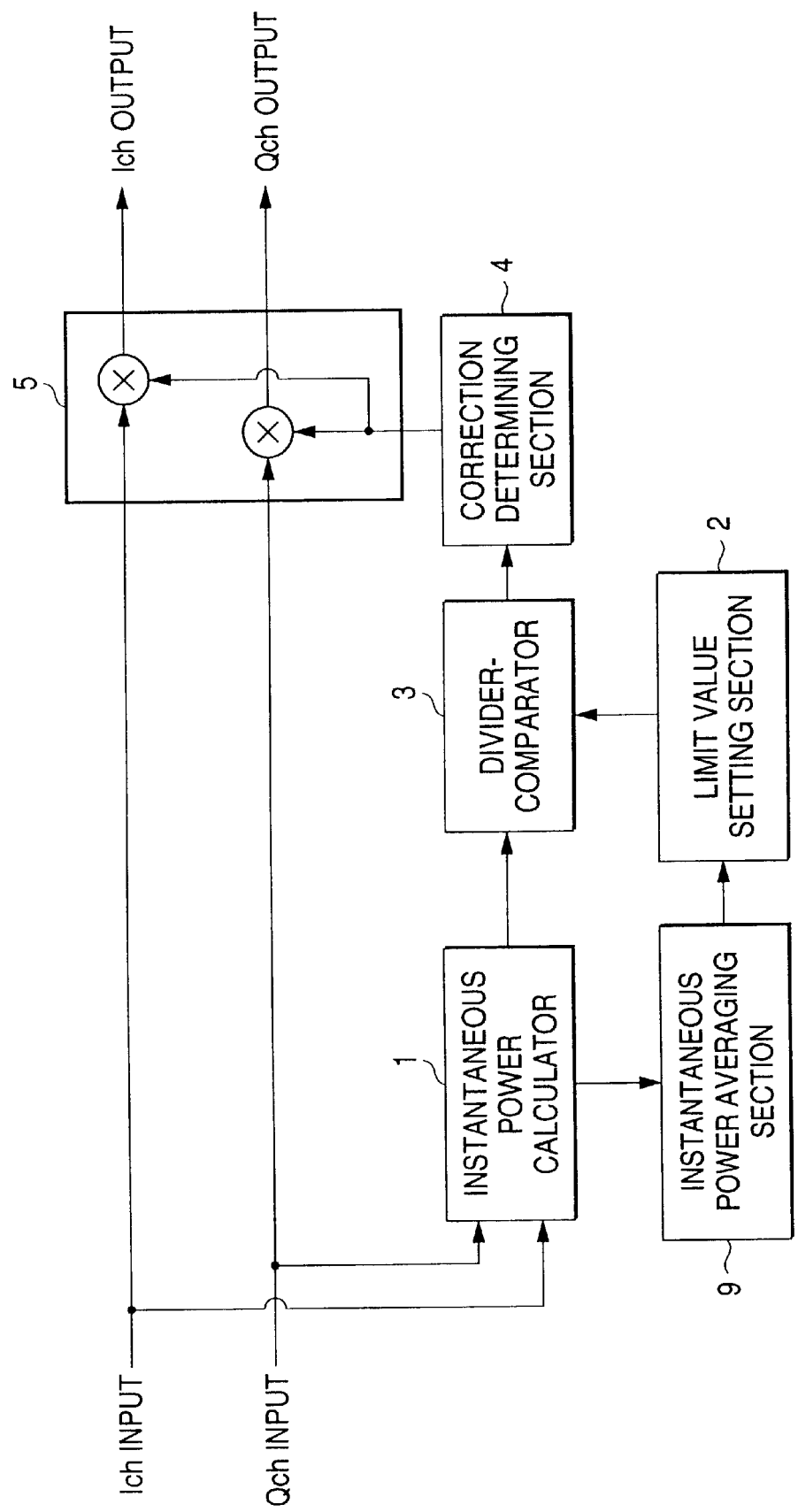
FIG. 6 shows a configuration of limiter apparatus according to the seventh embodiment of the invention which obtains the square value of the instantaneous power, sets a limit value from the average value of the instantaneous power value for an arbitrary period, making the limit value variable, and performs limit operation correspondingly to the number of users.

FIG. 6 shows a configuration of limiter apparatus according to the seventh embodiment of the invention. This apparatus is the same as the apparatus of the fifth and sixth embodiments except that the output of the instantaneous power averaging section 9 is input to the limit value setting section 2. This apparatus is characterized in that the output of the limit value setting section 2 is determined depending on the average value of instantaneous power. The remaining configuration is the same as the fifth embodiment.

Operation of the vector operation limiter apparatus according to this embodiment is described below.

An instantaneous power calculator 1 calculates an instantaneous power value of parallel input I channel and Q channel transmission data by using the expression $(Ich^2+Qch^2)^{1/2}$.

An instantaneous power averaging section 9 calculates the average value for an arbitrary period of the instantaneous power of I channel and Q channel input transmission data of the instantaneous power calculator 1. A limit value setting section 2 sets the optimum limit value based on the average value of instantaneous power of the instantaneous power averaging section 9. A divider-comparator 3 divides the limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. The correction determining section 4 determines that correction be skipped in case the comparison result of the divider-comparator 3 is equal to or greater than 1. The correction determining section 4 determines that correction be made in case the comparison result of the divider-comparator 3 is smaller than 1. In case the correction determining section 4 has determined that correction be made, a correction operating section multiplies the I channel and Q channel input transmission data by the division value used by the divider-comparator 3 to perform correction and outputs the resulting data. In case the correction determining section 4 has determined that correction be skipped, the correction operating section 5 multiplies the I channel and Q channel input transmission data by 1 and outputs the resulting data without compensation.

As mentioned earlier, according to this embodiment, the peak factor of I channel and Q channel input transmission data can be suppressed and limit value can be made variable depending on the increase/decrease in the number of users, by obtaining the instantaneous value of I channel and Q channel input transmission data and comparing the instantaneous value with the limit value set based on the average instantaneous value, then performing correction.

(Eighth Embodiment)

Figure 7:
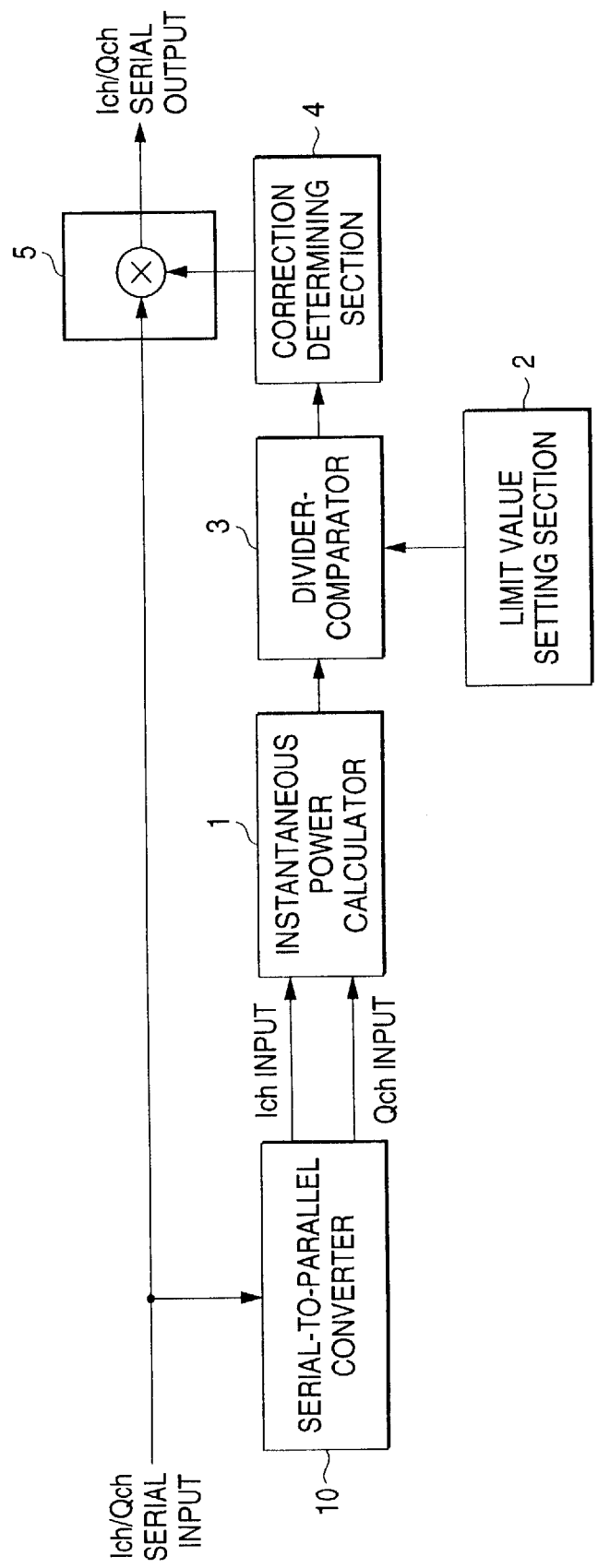
FIG. 7 shows a configuration of limiter apparatus according to the eighth embodiment of the invention which obtains the square value of the instantaneous power from serial input data, performs correction depending on the result of division-based comparison with a limit value, and outputs corrected data.

FIG. 7 shows a configuration of limiter apparatus according to the eighth embodiment of the invention. While in the first through seventh embodiments transmission data is parallel data, transmission data is serial data in this embodiment. As shown in FIG. 7, a serial-to-parallel converter 10 separates input data into I channel input and Q channel input and performs the same processing as the first embodiment, then outputs the resulting data as serial data.

Limiter apparatus according to this embodiment comprises a serial-to-parallel converter 10 to which serial I channel and Q channel transmission data is input, an instantaneous power calculator 1 to which I channel and Q channel transmission data thus converted to parallel data are input, a limit value setting section 2 for setting an arbitrary limit value, a divider-comparator 3 to which the instantaneous power value calculated by the instantaneous power calculator 1 and the limit value set by the limit value setting section 2 are input, a correction determining section 4 to which the comparison results of the divider-comparator 3 is input, and a correction operating section 5 to which the correction determination result of the correction determining section 4 is input.

Operation of the vector operation limiter apparatus configured as mentioned earlier is described below.

A serial-to-parallel converter converts the serially input I channel and Q channel transmission data to parallel I channel and Q channel transmission data. An instantaneous power calculator 1 calculates an instantaneous power value of the I channel and Q channel input transmission data by using the expression $(Ich^2+Qch^2)^{1/2}$.

A divider-comparator 3 divides an arbitrary limit value set by the limit value setting section 2 by the instantaneous power value calculated by the instantaneous power calculator 1 (the instantaneous power value as a denominator and the limit value as a numerator). A divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. The correction determining section 4 determines that correction be skipped in case the comparison result of the divider-comparator 3 is equal to or greater than 1. The correction determining section 4 determines that correction be made in case the comparison result of the divider-comparator 3 is smaller than 1. In case the correction determining section 4 has determined that correction be made, a correction operating section 5 multiplies the I channel and Q channel input transmission data by the division value used by the comparator 3 to perform correction and outputs the resulting data. In case the correction determining section 4 has determined that correction be skipped, the correction operating section 5 multiplies the I channel and Q channel input transmission data by 1 and outputs the resulting data without compensation.

As mentioned earlier, according to this embodiment, the peak factor of I channel and Q channel input transmission data can be suppressed by converting serial input I channel and Q channel transmission data to parallel I channel and Q channel transmission data, obtaining the instantaneous value of the I channel and Q channel transmission data, comparing the instantaneous value with the limit value, and performing correction. This requires a single unit for correction operation because of a serial input, thus downsizing the apparatus.

(Ninth Embodiment)

Figure 8:
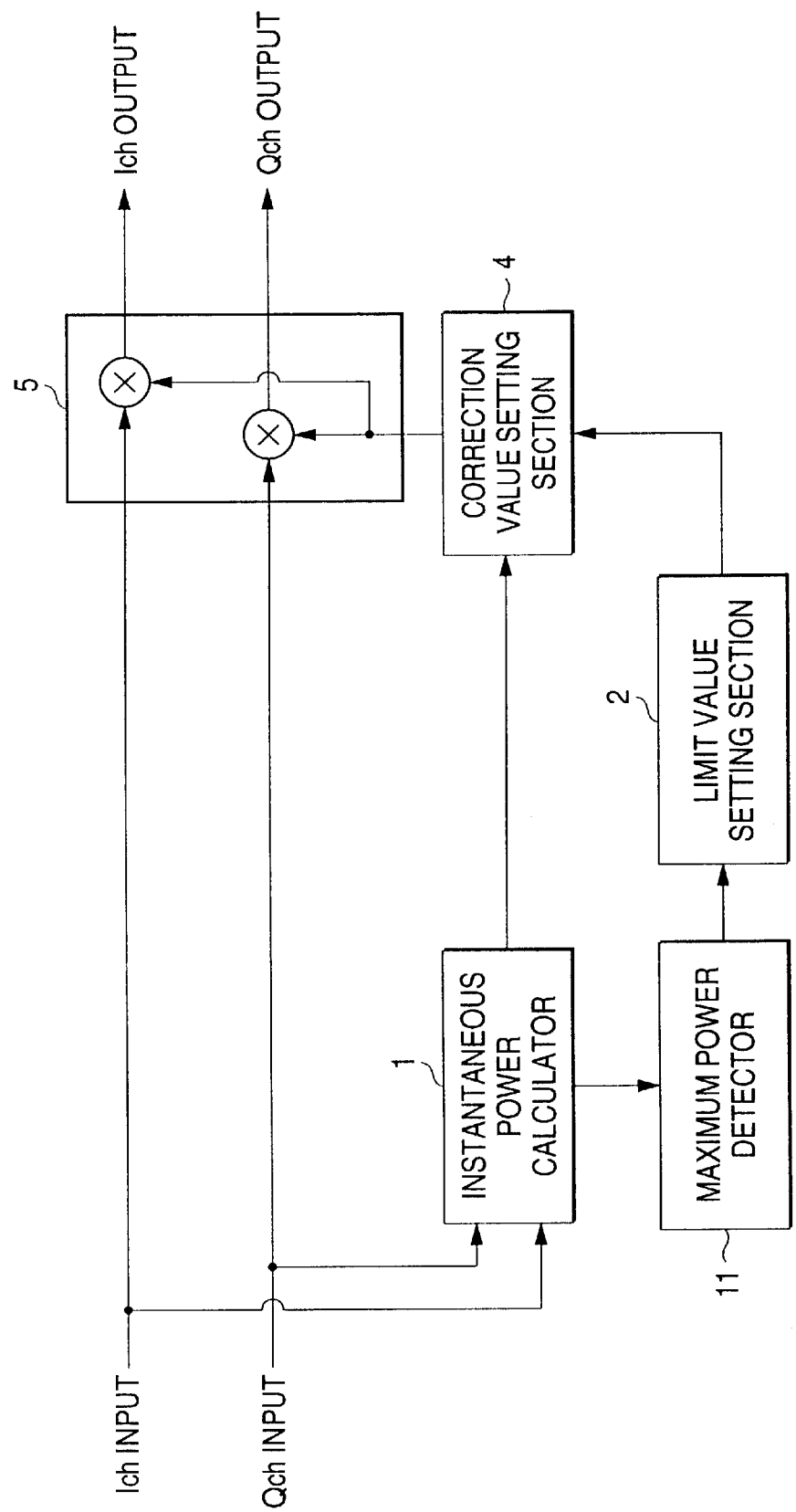
FIG. 8 shows a configuration of limiter apparatus according to the ninth embodiment of the invention which obtains the instantaneous power and maximum value of the arbitrary period, and performs normalization to the maximum value.

FIG. 8 shows a configuration of limiter apparatus according to the ninth embodiment of the invention. Limiter apparatus according to this embodiment is similar to limiter apparatus according to the first embodiment shown in FIG. 2, and characterized in that the limiter apparatus is adapted to comprise a maximum power detector 11 for detecting the maximum power for a certain period from an instantaneous power calculator 1 and to set the limit value of a limit value setting section 2 based on the output of the maximum power detector 11, the limiter apparatus comprising a correction volume setting section 7 adapted to set a correction value as a table from the limit value and the input data, depending on the output of a comparator and input data. The remaining configuration is the same as the first embodiment.

As shown in FIG. 8, limiter apparatus according to this embodiment comprises an instantaneous power calculator 1 to which parallel I channel and Q channel transmission data are input, a maximum power detector 11 for detecting the maximum power of the instantaneous value for an arbitrary period from the instantaneous power calculator 1, a limit value setting section 2 for comparing the maximum instantaneous power value of the maximum instantaneous power detector 11 with the arbitrary limit value to set a limit value, a correction value setting section 7 for setting a correction value from the limit value of the limit value setting section 2 and the instantaneous power value of the instantaneous power calculator 1, and a correction operating section 5 for multiplying the parallel input I channel and Q channel transmission data by the correction value of the correction value setting section 7.

Operation of the vector operation limiter apparatus is described below.

An instantaneous power calculator 1 calculates an instantaneous power value of parallel input I channel and Q channel transmission data by using the expression $(Ich^2+Qch^2)^{1/2}$.

A maximum power detector 11 obtains the maximum value of instantaneous power of the I channel and Q channel input transmission data of the instantaneous power calculator 1 for an arbitrary period. In case the maximum value of instantaneous power of the maximum power detector 11 is smaller than the limit value set by the limit value setting section 2, a correction operating section 5 multiplies the I channel and Q channel input transmission data by a value equal to or greater than 1 and outputs the resulting data. In case the maximum value of instantaneous power of the maximum power detector 11 is equal to or greater than the limit value set by the limit value setting section 2, a correction value setting section 7 divides the limit value set by the limit value setting section 2 by the maximum value of instantaneous power of the maximum power detector 11 (the maximum value of instantaneous power as a denominator and the limit value as a numerator). The correction value setting section 7 compares the maximum value of instantaneous power with the limit value. In case comparison result of the correction value setting section is equal to or greater than 1, a correction operating section 5 multiplies I channel and Q channel input transmission data by this value to expand the I channel and Q channel input transmission data value and outputs the resulting data. In case comparison result of the correction value setting section is smaller than 1, the correction operating section 5 multiplies the I channel and Q channel input transmission data by the division value used by the correction value setting section 7 for dividing the maximum value of instantaneous power of the maximum power detector 11 by the limit value set by the limit value setting section 2, to perform correction and outputs the resulting data.

As mentioned earlier, according to this embodiment, the peak factor of I channel and Q channel input transmission data can be suppressed by normalizing the maximum value of instantaneous power to the limit value and compressing the I channel and Q channel input transmission data.

(Tenth Embodiment)

Figure 9:
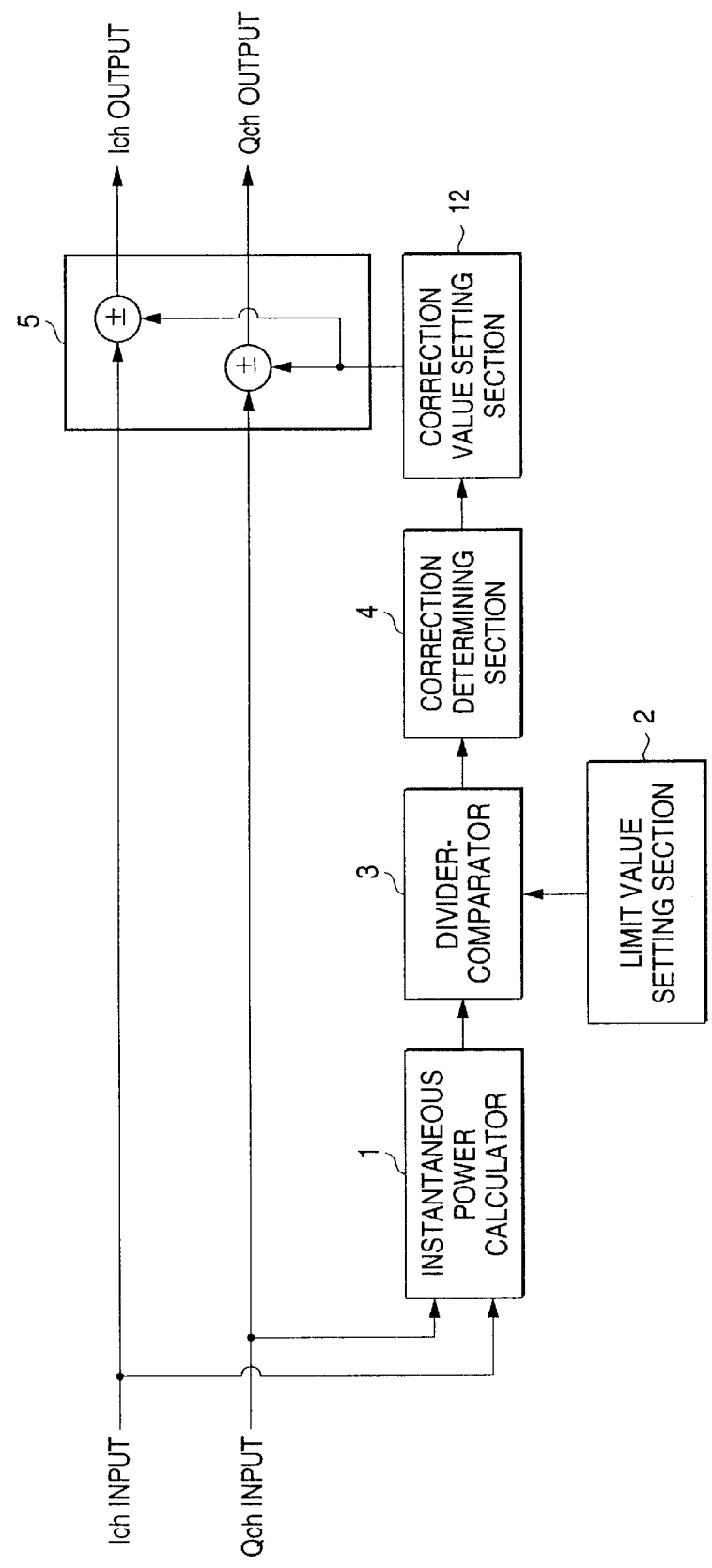
FIG. 9 shows a configuration of limiter apparatus according to the tenth embodiment of the invention which obtains the instantaneous power, limits the power depending on the result of division-based comparison with a limit value, adds or subtracts correction value then outputs corrected data.

FIG. 9 shows a configuration of limiter apparatus according to the tenth embodiment of the invention. Limiter apparatus according to this embodiment is similar to limiter apparatus according to the first embodiment shown in FIG. 2, and characterized in that the limiter apparatus is comprises a correction volume setting section 12 and a correction value setting is made therein via table format depending on the output of a comparator and input data. The remaining configuration is the same as the first embodiment.

Limiter apparatus according to this embodiment comprises an instantaneous power calculator 1 to which parallel I channel and Q channel transmission data are input, a limit value setting section 2 for setting an arbitrary limit value, a divider-comparator 3 to which the instantaneous power value calculated by the instantaneous power calculator and the limit value set by the limit value setting section are input, a correction determining section 4 to which the comparison results of the divider-comparator 3 is input, a correction volume setting section 12 for setting correction volume based on data from the correction determining section 4, and a correction operating section 5 for performing correction by using the correction volume set by the correction volume setting section 12.

Operation of this vector operation limiter apparatus is described below.

An instantaneous power calculator 1 calculates an instantaneous power value of parallel input I channel and Q channel transmission data by using the expression $(Ich^2+Qch^2)^{1/2}$.

A divider-comparator 3 divides an arbitrary limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. The correction determining section 4 determines that correction be skipped in case the comparison result of the divider-comparator 3 is equal to or greater than 1. The correction determining section 4 determines that correction be made in case the comparison result of the divider-comparator 3 is smaller than 1. In case the correction determining section 4 has determined that correction be made, a correction volume setting section 12 sets a correction volume value depending on the division value of an arbitrary limit value set by the limit value setting section 2 by the instantaneous power value calculated by the instantaneous power calculator. The correction volume value set by the collection volume setting section 12 is added to or subtracted from the I channel and Q channel input transmission data to correct the I channel and Q channel input transmission data then the resulting data is output. In case the correction determining section 4 has determined that correction be skipped, the correction operating section assumes 0 as a correction volume value and outputs the I channel and Q channel input transmission data without correction. The divider-comparator 3 in this embodiment may be replaced with a subtracter-comparator to perform subtraction. This further simplifies the operation.

As mentioned earlier, according to this embodiment, the peak factor of I channel and Q channel input transmission data can be suppressed by obtaining the instantaneous value of I channel and Q channel input transmission data and comparing the instantaneous value with the limit value, then performing correction. Use of an adder and subtracter can upgrade the correction operation accuracy.

(Eleventh Embodiment)

Figure 10:
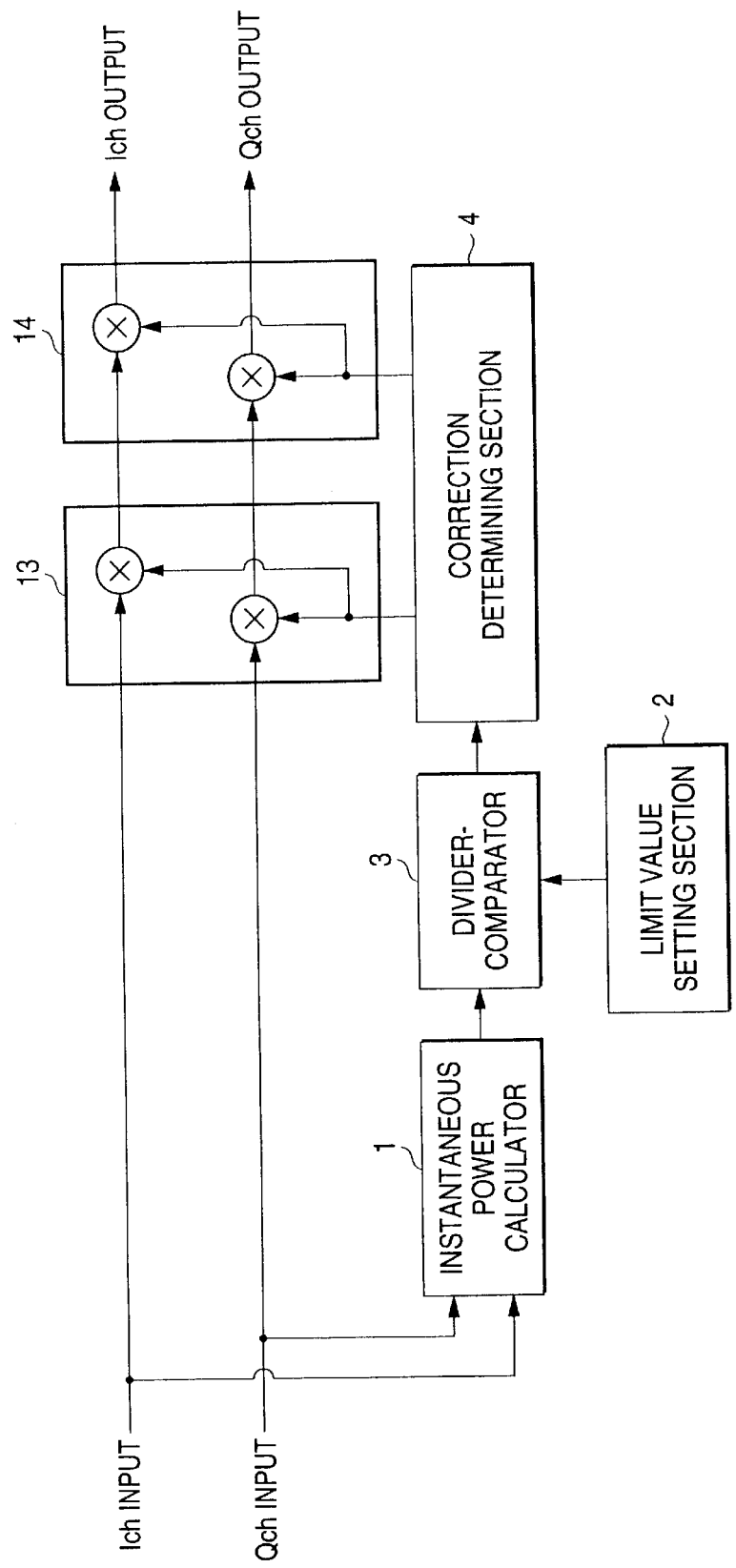
FIG. 10 shows a configuration of limiter apparatus according to the eleventh embodiment of the invention which obtains the instantaneous power and performs correction once or twice depending on the result of division-based comparison with a limit value.
Figure 11:
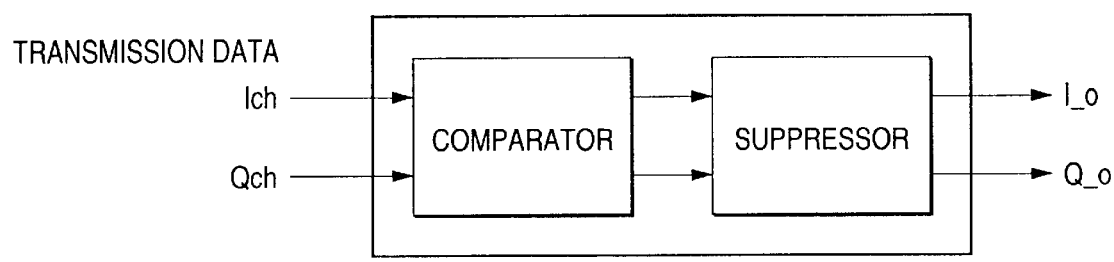
FIGS. 11 and 13 show an embodiment of a limiting apparatus according to the conventional art.
Figure 12:
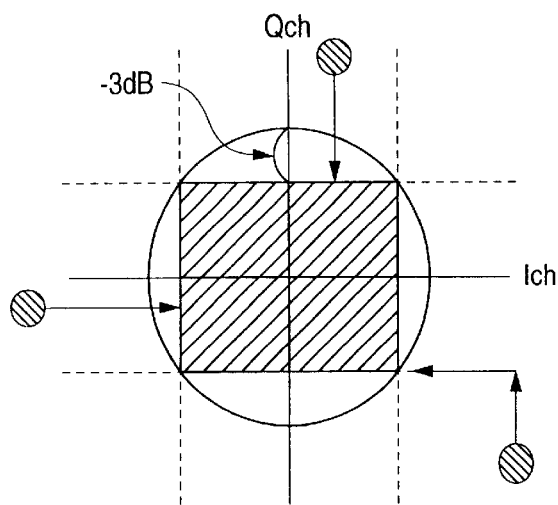
FIGS. 12 and 14 show a limit area and a limiting method according to the conventional art.
Figure 13:
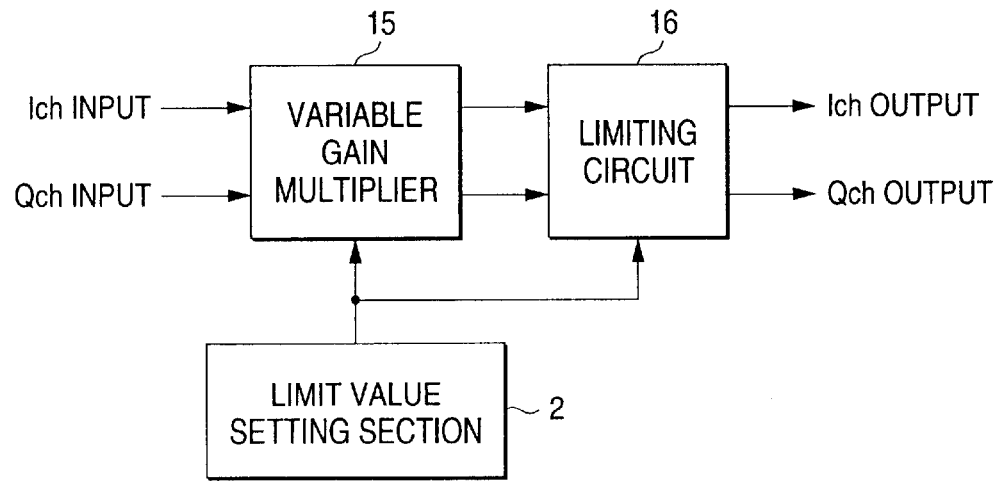
Figure 14:
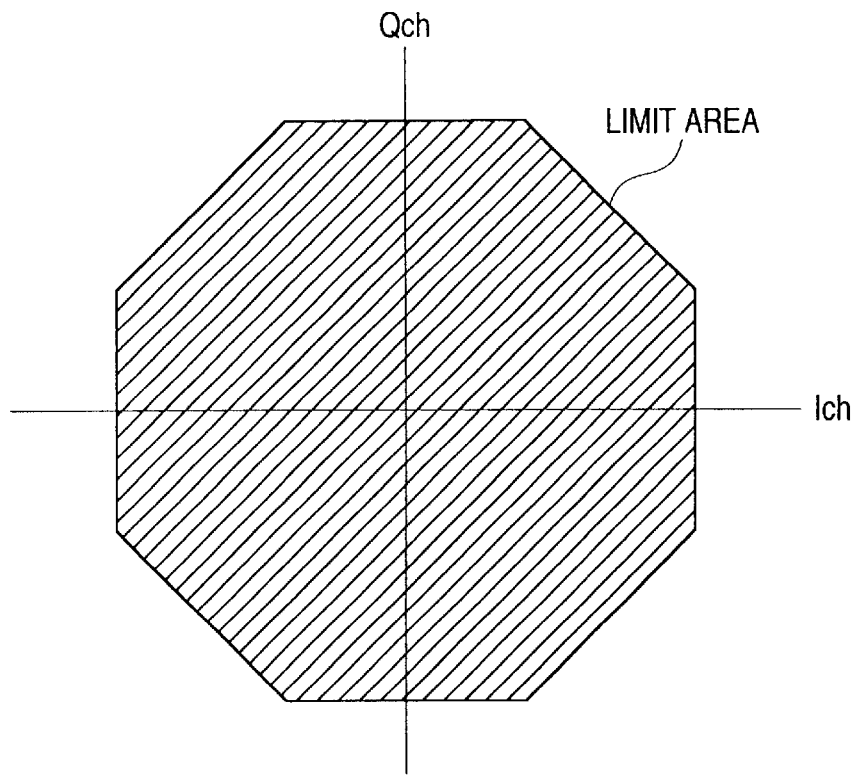

FIG. 10 shows a configuration of limiter apparatus according to the tenth embodiment of the invention. Limiter apparatus according to this embodiment is characterized in that correction operation is performed twice to upgrade the correction operation accuracy. In the figure are shown an instantaneous power calculator 1, a limit value setting section 2, a divider-comparator 3, a correction determining section 4, a primary correction operating section 13, and a secondary correction operating section 14.

Limiter apparatus according to this embodiment comprises an instantaneous power calculator 1 to which parallel I channel and Q channel transmission data are input, a limit value setting section 2 for setting an arbitrary limit value, a divider-comparator 3 to which the instantaneous power value calculated by the instantaneous power calculator and the limit value set by the limit value setting section are input, a correction determining section 4 to which the comparison results of the divider-comparator 3 is input, a primary correction operating section 13 to which the result of the correction determining section 4 is input, and a secondary correction operating section 14 to which the result of the primary correction operating section 13 is input.

Operation of this vector operation limiter apparatus is described below.

An instantaneous power calculator 1 calculates an instantaneous power value of parallel input I channel and Q channel transmission data by using the expression $(Ich^2 + Qch^2)^{1/2}$.

A divider-comparator 3 divides an arbitrary limit value set by the limit value setting section 2 by the instantaneous power value calculated by the instantaneous power calculator 1 (the instantaneous power value as a denominator and the limit value as a numerator). The divider-comparator 3 compares the instantaneous power value with the limit value based on whether the division value is greater than 1 or not. A correction determining section 4 determines whether the I channel and Q channel input transmission data is to be corrected or not from the comparison result of the divider-comparator 3. In case the correction amount is large from the result of the correction determining section 4, a primary correction operating section 13 and a secondary correction operating section 14 are used to perform correction twice. In case the correction amount is small from the result of the correction determining section 4, a primary correction operating section 13 or a secondary correction operating section 14 is used to perform correction.

Thus, according to this embodiment, the peak factor of I channel and Q channel input transmission data can be suppressed by obtaining the instantaneous value of I channel and Q channel input transmission data and comparing the instantaneous value with the limit value, then performing correction. Performing correction twice can upgrade the correction operation accuracy.

While correction operation is performed twice in the eleventh embodiment, further correction operation stages may be provided to repeat correction. The correction determining section may use different weighing each time correction is performed.

Thus, the invention provides excellent limiter apparatus with no excessive peak suppression wherein the peak factor of I channel and Q channel input transmission data can be suppressed better by providing an instantaneous power calculator, a limit value setting section, a comparator, a correction determining section, and a correction operating section in order to define a limit area of concentric circles having the origin of I channel and Q channel coordinate axes as a center in case I channel value and Q channel value of I channel and Q channel input transmission data values are represented along coordinate axes, without suppressing the transmission power, than by limiting the I channel and the Q channel individually.

What is claimed is:

1. A limiter apparatus comprising:
   an instantaneous power calculator for calculating an instantaneous power value from transmission data;
   a limit value setting section for setting a limit value;
   a comparator for comparing the instantaneous power value with the limit value;
   a correction determining section for determining whether transmission data is to be corrected, depending on the comparison result of the instantaneous power value and the limit value; and
   a correction operating section for correcting the transmission data based on a correction value determined by said correction determining section;
   wherein the instantaneous power calculator calculates the square value of parallel input I channel and Q channel transmission data without performing root operation of the data,
   wherein the comparator includes a subtracter-comparator for subtracting the limit value from the instantaneous power value calculated by the instantaneous power calculator to compare the square value of the instantaneous power with the limit value.

2. A limiter apparatus comprising:
   an instantaneous power averaging section for calculating an instantaneous power value from parallel input I channel and Q channel transmission data and obtaining the average value of instantaneous power for a certain period;
   a limit value setting section for setting a limit value;
   a comparator for comparing the instantaneous power average value with the limit value;
   a correction determining section for determining whether said transmission data is to be corrected, depending on the comparison of the average value of the instantaneous power with the limit value; and
   a correction operating section for correcting the transmission data based on a correction value determined by said correction determining section
   wherein the instantaneous power calculator includes a second instantaneous power calculator for calculating the square value of parallel input I channel and Q channel transmission data without performing root operation of the data,
   wherein the comparator includes a subtracter-comparator for subtracting the limit value set by the limit value setting section from the instantaneous power value calculated by said instantaneous power calculator to compare the square value of the instantaneous power with the limit value.

* * * * *